United States Patent [19]
Fujimoto et al.

[11] Patent Number: 5,254,954
[45] Date of Patent: Oct. 19, 1993

[54] DEFECT DETECTING APPARATUS AND METHOD FOR DETECTING A DEFECT IN AN INSULATOR USING AN ELECTRIC DISCHARGE SENSE BY AN OPTICAL PICKUP

[75] Inventors: Takahiro Fujimoto, Nishio; Hiroshi Nakatani, Kuwana, both of Japan

[73] Assignee: Nippondenso Co., Ltd, Kariya, Japan

[21] Appl. No.: 852,519

[22] Filed: Mar. 17, 1992

[30] Foreign Application Priority Data

Mar. 18, 1991 [JP] Japan ................................. 3-52703

[51] Int. Cl.$^5$ ...................... G01R 31/00; G01R 31/12
[52] U.S. Cl. ................................... 324/551; 324/393; 324/536; 324/557; 324/501
[58] Field of Search ............... 324/501, 502, 536, 551, 324/552, 554, 557, 393, 395, 399, 400, 401

[56] References Cited

U.S. PATENT DOCUMENTS

3,978,720  9/1976  Ford .................. 324/395 X
5,128,618  7/1992  Yamada et al. .................. 324/501

FOREIGN PATENT DOCUMENTS

3326344  1/1985  Fed. Rep. of Germany ...... 324/501

*Primary Examiner*—Gerard R. Strecker
*Assistant Examiner*—Diep Do
*Attorney, Agent, or Firm*—Cushman, Darby & Cushman

[57] ABSTRACT

An apparatus for detecting a defect in an insulator formed therein with an axially extending hollow section; having a hold section 2 for holding the insulator, a first electrode 3 inserted in the hollow section 1a of the insulator 1, and a second electrode provided outside of the insulator 1. An electric discharge structure 10 produces an electric discharge between the first and second electrodes 3, 5, a path recognizes 11, 12, 13 for recognizes whether the electric discharge passes through a predetermined path, and a discriminating structure 14 for discriminates whether the insulator 1 is satisfactory, in accordance with a signal from the path recognizes.

10 Claims, 8 Drawing Sheets

FIG. 8(A)1
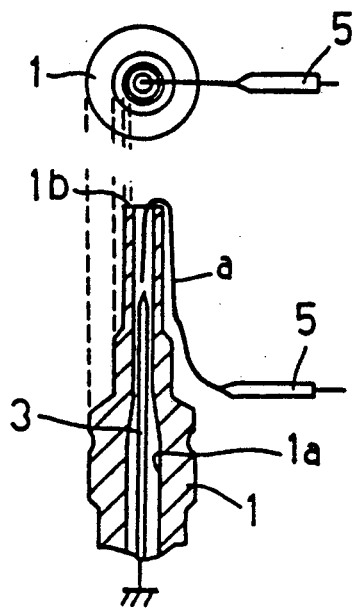
FIG. 8(A)2
FIG. 8(B)1
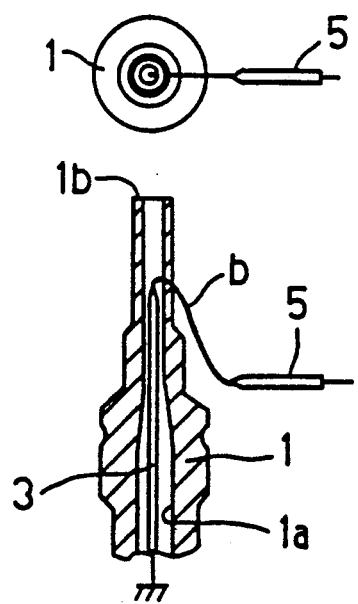
FIG. 8(B)2

DEFECT DETECTING APPARATUS AND METHOD FOR DETECTING A DEFECT IN AN INSULATOR USING AN ELECTRIC DISCHARGE SENSE BY AN OPTICAL PICKUP

BACKGROUND OF THE INVENTION

1. Field of the Invention

The present invention relates to a defect detecting apparatus for insulators, and in particular to an apparatus for detecting a defect such as a pinhole or the like on an insulator of a spark plug for an internal combustion engines.

2. Description of the Prior Art

A conventional defect detecting method for insulators has detected a pinhole in an insulator since such will cause misfiring of a sparkplug for an internal combustion engines.

This defect detecting method is based on the application of a voltage between the center electrode and the housing of a sparkplug generating a spark discharge between the center electrode and an earth electrode normally if no defect is present in the insulator of the spark plug. However, if there is a defect, then spark discharge between the center electrode and the housing will occur while no spark discharge occurs between the center electrode and the earth electrode. Therefore, such defect detection of the insulator is very important.

Accordingly, the applicants have proposed the following method of detecting a defect in an insulator as a defect detecting method for an insulator, based on the path of spark discharge differing depending upon whether a defect in the insulator present or not.

A specific form of the above-mentioned defect detecting method will be explained hereinbelow with reference to FIG. 7.

In order to detect a pinhole as one of detects in the insulator of spark plug, a first electrode 3 is inserted in a hollow section 1a of an insulator 1, a second electrode 5 is set at a position outside of the insulator where electric discharge is possible, as shown in FIG. 7, and a potential difference is generated between the electrodes 3 and 5 by a high voltage generating device 10 as an electric discharge means so as to cause electric discharge between the first electrode 3 and the second electrode 5.

This arrangement allow the path of the produced spark discharge to differ between a satisfactory insulator in which no pinhole is present and a defective insulator in which a pinhole is present, as shown in FIGS. 8A and 8B. That is, in the satisfactory insulator in which no pinhole is present, discharge follows an electric discharge path "a" which passes through the front end surface 1b of the insulator 1 as shown in FIG. 8A, but in the detective insulator in which a pinhole is present, discharge passes an electric discharge path "b" which passes through the pinhole as a defect in the insulator 1 as shown in FIG. 8B. Accordingly, the difference between the spark discharge paths "a" and "b" is visually checked by a manual technique (human eyes) so as to determine whether the insulator is defective.

By using the above-mentioned method, a defect in a simple insulator can be detected, and accordingly, it is sufficient to discard only insulators in which a defect is detected. Thereby the checking of insulators have been rationalized. However, in the above-mentioned detecting method, the following drawbacks have been noted. First, since the difference between the spark discharge paths is manually checked, human error may cause variations in the rate of detection of defects. Therefore, the reliability of the checking becomes dependent on the reliability of the checker. Further since the man-hours for the checking are large, the cost of total inspection becomes high.

Accordingly, the present invention is devised in view of the above-mentioned drawbacks, and it is an object of the invention to allow automatic checking whether an insulator is satisfactory instead of using a visual inspection in the above-mentioned checking steps.

SUMMARY OF THE INVENTION

According to a first aspect of the present invention, there is provided an apparatus for detecting a defect in an insulator which comprises: a holding section for holding the insulator which is formed a hollow section therein, an electric discharge means for letting electric discharge generate between the inside and the outside of the insulator, a path recognizing means for recognizing at least either a signal which is obtained by a electric discharge generated by the electric discharging means passing through a predetermined path or a signal which is obtained by an electric discharge generated by the electric discharging means passing through a path other than the predetermined path, and a discriminating means for performing discrimination which corresponding to a signal detected by said path recognizing means.

Further, according to a second aspect of the invention, there is provided an apparatus for detecting a defect in an insulator which comprising: a hold means for holding the insulator having a hollow section; a first electrode adapted to be inserted in the hollow section of the insulator; a second electrode to be formed on a side surface of the insulator within a range where electrode discharge is capable between itself and the first electrode; an electric discharging means which letting spark discharge generate; a path recognizing means which is provided at the top portion of the insulator and recognizing whether a spark discharge which is generated by the application of the potential difference between the first and second electrodes passes through the top portion of the insulator or not, and out put a signal corresponding to the recognition; and a discriminating means for discriminating whether the insulator is defective or not, in accordance with the signal from the path recognizing means.

Further, a third aspect of the present invention, there is provided an apparatus for detecting a defect in the insulator formed a center electrode in its hollow portion which comprising; a hold means for holding the insulator; an electrode provided circumference of the insulator and within a range in which electric discharge can be effected between itself and the center electrode; an electric discharging means which letting an electric discharge generate by giving a potential difference between the center electrode of the insulator and the electrode; a path recognizing means provided at the top portion of the insulator, for recognizing whether the spark discharge which is generated when the potential difference is given to the electric discharge means is generated between the top portion of the center electrode and the electrode or not, and out put a signal corresponding to the recognition; and a discriminating means for discriminating the insulator in accordance with the signal from the path recognizing means.

Further, according to a fourth aspect of the present invention, there is provided an apparatus for detecting a defect in an insulator of a spark plug for internal combustion engines which comprising: a hold means for holding the spark plug for internal combustion engines; an electric discharging means for letting the potential difference generate between the center electrode and the housing so as to be able to generate a spark discharge between the center electrode and the earth electrode; a path recognizing means for recognizing whether a spark discharge is generated or not between the center electrode and the earth electrode when the potential difference is given to the electric discharging means, and out put a signal corresponding to the recognition; and a discriminating means for discriminating the spark plug for internal combustion engines in accordance with the signal out put from the recognizing means.

In the first aspect of the present invention, since the construction mentioned above is adopted, in the case that the insulator is held with the hold means and letting a spark discharge generate between the inside and the outside of the insulator by the electric discharging means, the spark discharge passes through a predetermined electric discharge path if no defect is present in the insulator, but the spark discharge does not path through the predetermined electric discharge path if a defect is present in the insulator, because the spark discharge passes through inside of the defect. In the present invention, paying attention with this difference between these paths of the spark discharge, a difference between signals which is obtained with the above-mentioned difference of the path is recognized by the path recognizing means, and whether the insulator is satisfactory or not is discriminated by the discriminating means in accordance with the signal.

In the second aspect of the present invention, when a spark discharge is generated by the electric discharging means between the first electrode inserted in the hollow portion of the insulator and the second electrode provided at the outside of the insulator, a spark discharge generated goes from the top portion of the first electrode to the second electrode through the top portion of the insulator if no defect is present in the insulator. Meanwhile, if a defect is present in the insulator, a spark discharge generated between the first and second electrodes does not go through the top portion of the insulator but goes through the defect in the insulator. Thus, with the use of the difference between the spark discharges, a difference between the spark discharge paths due to the presence of a defect in the insulator is recognized by providing the path recognizing means at the top portion of the insulator so that whether the insulator is satisfactory or not is discriminated by the Q discriminating means.

Further, in the third aspect of the present invention, when letting a spark discharge generate by the electric discharging means between the center electrode formed in the hollow portion of the insulator and the electrode formed outside of the insulator, the spark discharge is generated between the top end of the center electrode and the electrode set outside of the insulator if no defect is present in the insulator, but if a defect is present in the insulator, the spark discharge is generated between the center electrode and the electrode through this defect. Thus, only by recognizing by the path recognizing means whether or not the spark discharge is produced between the top end of the center electrode and the electrode when the potential difference is given between the center electrode and the electrode by the electric discharging means, defects in the insulator can be detected.

Further, in the fourth aspect of the present invention, in the case that a defect in the insulator of a spark plug for internal combustion engines is detected, whether or not an electric discharge is generated between the center electrode and the earth electrode of the spark plug when a potential difference is given by the electric discharging means between the center electrode and the housing, is recognized by the path recognizing means, thereby the presence of defects in the insulator can be discriminated by the discriminating means.

BRIEF DESCRIPTION OF THE DRAWINGS

FIGS. 8A1,A2 and 8B1,B2 are explanatory views showing a difference path of electric discharge due to whether there are defects in the insulator or not.

DETAILED DESCRIPTION OF THE PREFERRED EMBODIMENTS

Figure 1:
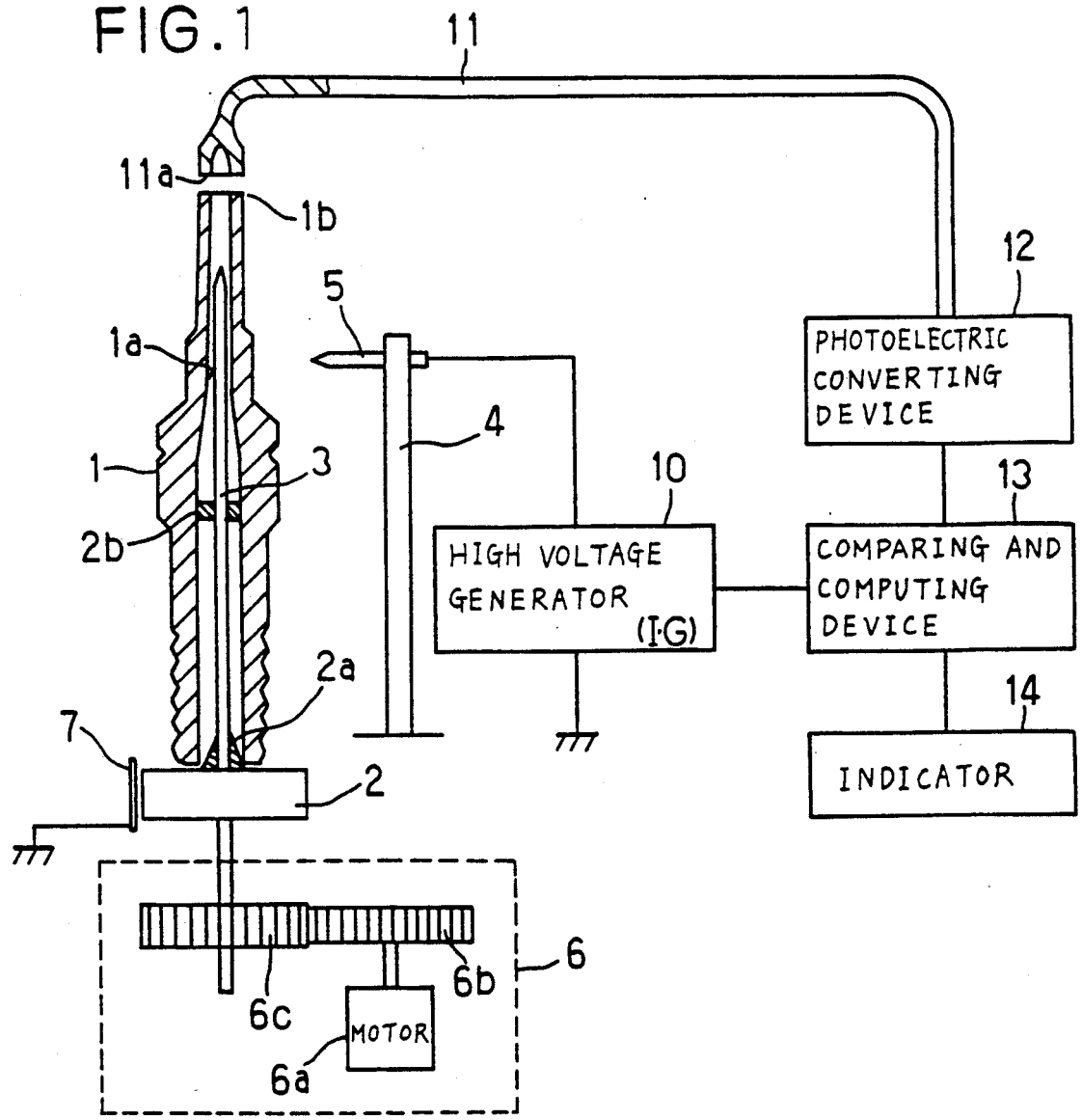
FIG. 1 is a general view illustrating a defect detecting apparatus according to a first embodiment of the invention;.

FIG. 1 is a general view showing a first embodiment of an apparatus for detecting a defect in an insulator, to detect a pinhole defect in the insulator of a spark plug.

FIG. 1 shows insulator 1 of a spark plug for an internal combustion engine. The insulator 1 includes hollow portion 1a extending in the axial direction. This insulator 1 is fixed on a holder 2 so that the insulator is maintained always at a constant position by means of a conical guide 2a formed on the holder 2 which is a holding portion, and having electrical conductivity means of a rubberring ring 2b inserted in the hollow portion 1a and having a diameter slightly larger than the inner diameter of the hollow portion 1a. Further, a needle-like second electrode 5 which can generate electric discharge between itself and the needle-like first electrode 3 and which is insulated and fixed by a second electrode holder 4 made of an insulating material, is provided in the vicinity of the insulator 1.

The holder 2 is coupled with a turning device 6, which includes a motor 6a and gears 6b, 6c coupled to the motor 6a. When the motor 6a is driven, the insulator 1 is rotated together with the holder 2 through the gears 6b, 6c.

This holder 2 makes continual contact with a brush 7 which is grounded, and accordingly, the first electrode 3 is grounded by the brush 7 contacting the holder 2. The second electrode 5 is connected with a high voltage generator 10 serving as an electric discharge means. This high voltage generator 10 generates a voltage with a constant frequency, which voltage can generate a spark discharge between the second electrode 5 and the grounded first electrode by applying the high voltage to the second electrode 5 at the condition that the insulator 1 is held on the holder 2, and output therefrom a timing signal synchronized with the timing of the voltage generation along with the generation of the voltage. Light receiving device 11 is a path recognizing means that catches the light at the time when a spark discharge that is generated between the first electrode 3 and second electrodes 5 passes over the top surface 1b of the insulator 1, and which is formed of, for example, a bundle of many optical fibers.

Figure 2:
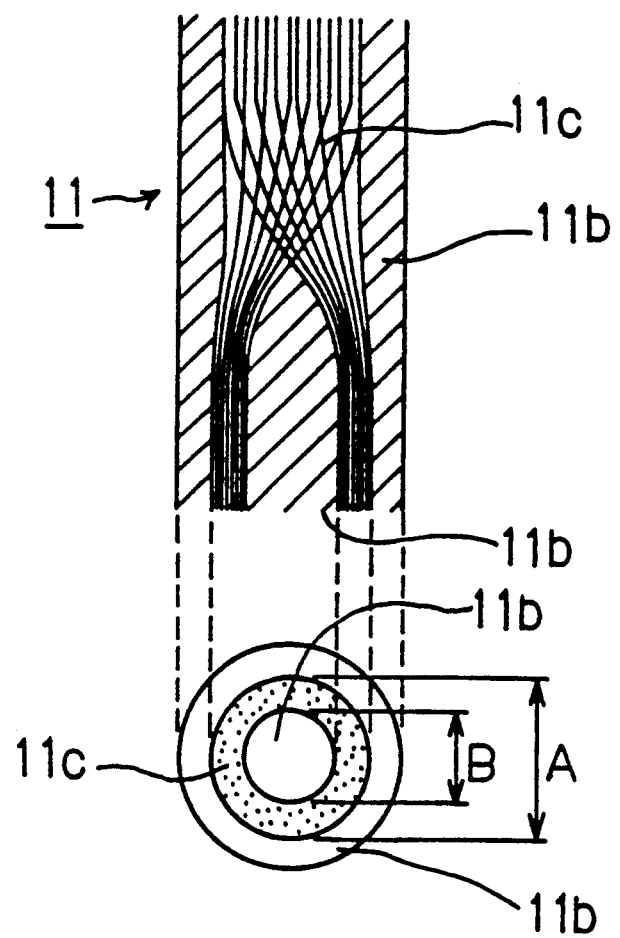
FIG. 2 is an enlarged view illustrating a top portion of a path recognizing means according to the first embodiment of the invention.

FIG. 2 is an enlarged sectional view illustrating the above-mentioned light receiving device 11.

FIG. 2 shows the light receiving device 11 formed with the bundle of optical fibers 11c by a silicon resin 11b. The light receiving device has a doughnut-like part 11c having an outer diameter A smaller than that of an outer diameter the ring-like top end part 1b of the insulator 1 and having a inner diameter B larger than that of an inner diameter the top end surface 1b at the top surface of the bundle 11 by means of the silicon group insulating material 11b. The light can be received only through the doughnut-like part.

If the light receiving device 11 received light from the inner periphery of the top portion, it would recognize even light from a spark discharge which is generated within the insulator 1 between the first and second electrodes through a defect, if any, in the insulator 1. If the light receiving device 11 were to receive light from the inner periphery of the top portion 1b of the insulator 1, it would not be able to isolate defects in the insulator 1. The light receiving device 11 would recognize a spark discharge between the first electrode 3 and second electrode 5 if the outer diameter of the doughnut-like part of the light receiving device 11 were to be larger than that of the top portion 1b of the insulator 1. Accordingly, this would not allow the defect in the insulator to be detected.

It is noted that the distance between the front end 11a of the light receiving device 11 and the top portion 1b of the insulator is determined by the inner and outer diameters of the front end 11a of the light receiving device 11, and the aperture angle of the light receiving device 11, and accordingly, the light receiving part of the doughnut-like part which bulges out from the top portion 1b of the insulator 1 is formed thereover with a light shield film 11b, due to the reason mentioned above.

A photoelectric converting device 12 is one component of the path recognizing means. The photoelectric converting device 10 is incorporated therein with a photoelectric converting element which is formed of a Si photodiode or the like, for converting a light signal delivered from the light receiving device 11 into an electric signal, and a signal amplifying circuit for amplifying the electric signal delivered from the photoelectric converting element and corresponding to the light signal received by the latter.

A comparing and computing device 13 receives the photoelectrically converted light signal. The comparing and computing device 13 includes of an A/D converter for converting an analog signal after photoelectric conversion into a digital signal and a digital comparator which receives, the timing signal which is produced simultaneously with the generation of high voltage from the high voltage generator 10 as a signal for energizing the comparing and computing device, comparing device 13 compares the electric signal from the photoelectric converting device 12 at the time when the timing signal is received with a set value for the electric signal which is stored beforehand in the comparing and computing device 13. If the electric signal from the photoelectric converting device 12 is greater than the set value for the electrical signal, a comparison similar to that at the present timing is carried out at the time when the next timing signal is received. However if the electrical signal from the photoelectric converting device 12 is smaller than the set value for the electric signal, a defect signal is issued. Further, the comparing and computing device 13 includes a counter or the like for counting timing signals from the high voltage generator 10 so as to count a cycle number of the timing signals delivered from the high voltage generator 10. The comparing and computing device 13 issues an inspection completion signal when the count cycle number of the timing signal reaches a set cycle number which is stored beforehand in the comparing and computing device 13.

An indicator 14 is a discriminating means for indicating a result of the inspection, that is, whether or not the insulator has had a satisfactory pin-hole inspection, using a lamp or the like. If a signal from the comparing and computing device 13 is the inspection completion signal, the indicator 14 indicates "good" thereon, but if a signal from the comparing and computing device 13 is the defect signal, it indicates "no good" thereon.

Figure 3:
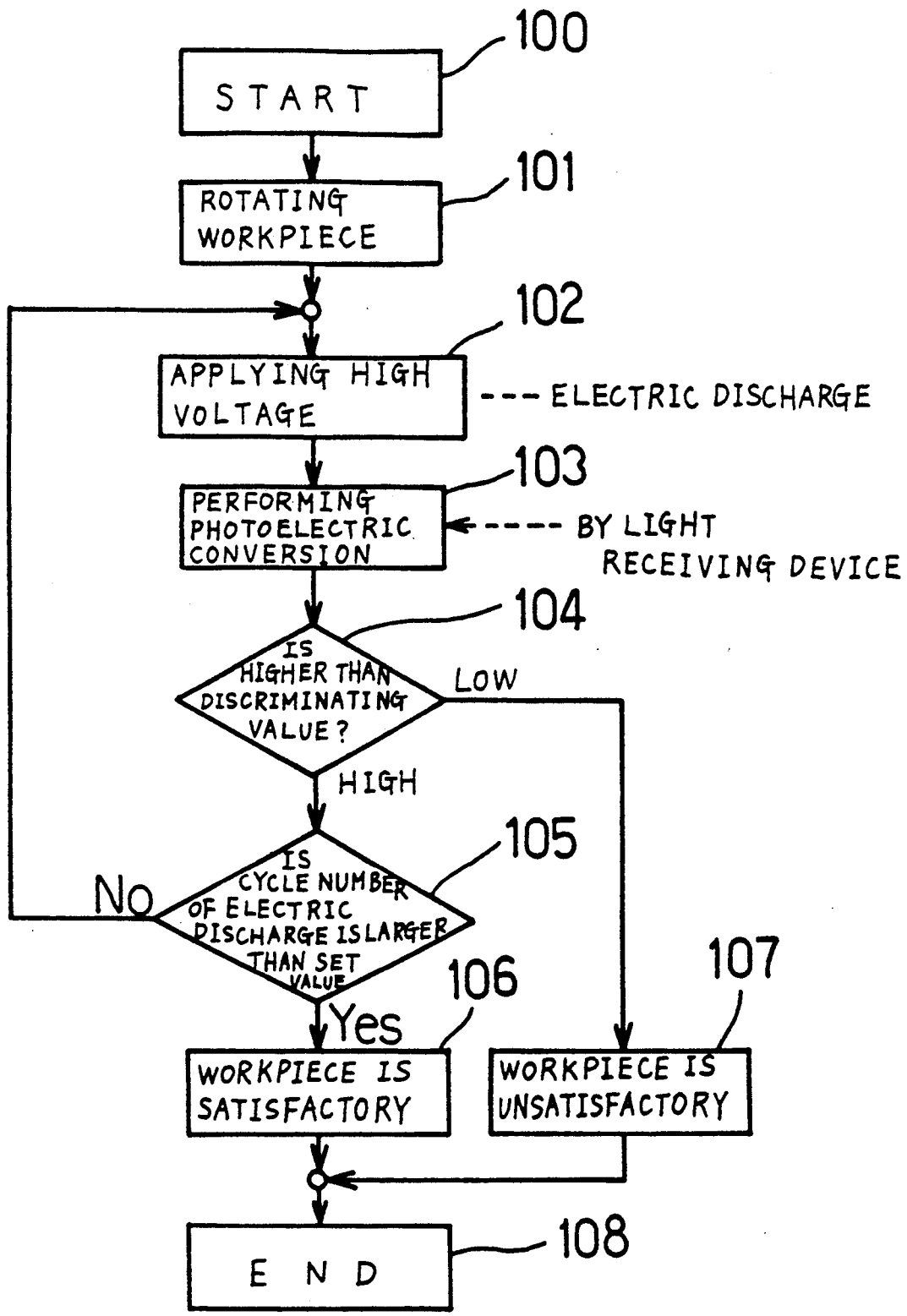
FIG. 3 is a flow-chart showing the operation of the first embodiment of the invention.
Figure 4:
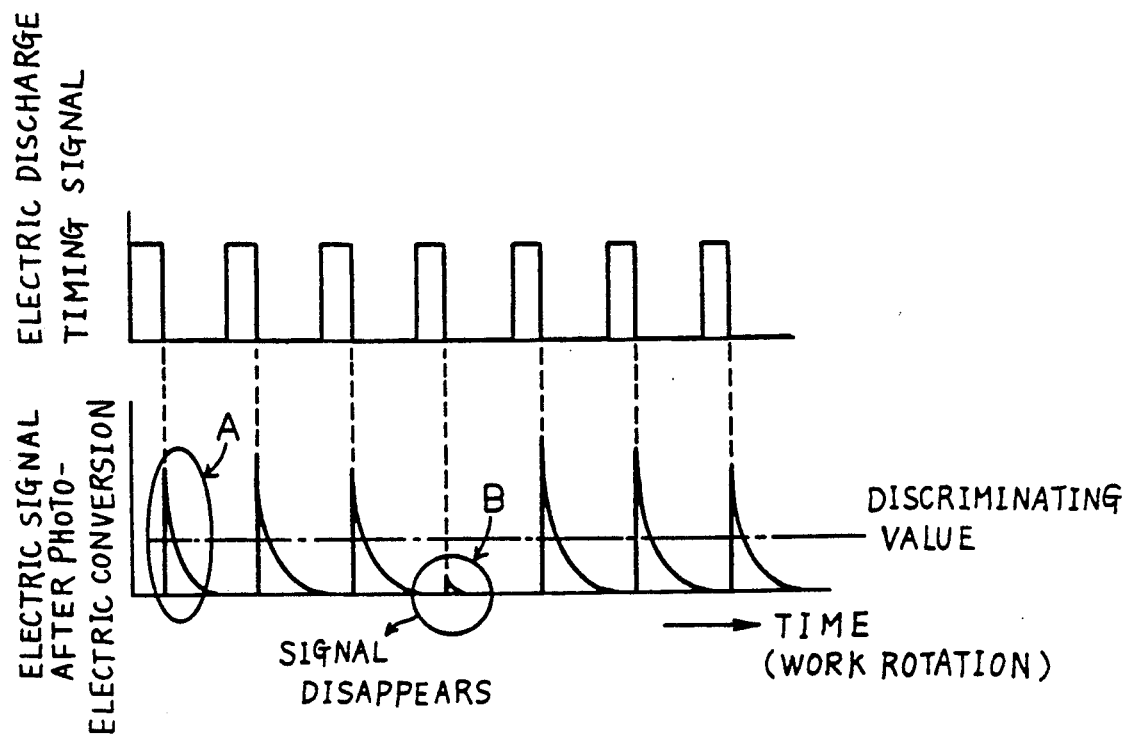
FIG. 4 is a timing chart showing the operation of the first embodiment of the invention.

Next, an explanation will be made hereinbelow of the operation of the defect detecting apparatus for insulators in this embodiment with reference to the flow chart of FIG. 3 and the time chart of FIG. 4.

When the inspection is started at start step 100, the holder 2 for the insulator to be inspected is rotated at a predetermined rotational speed by the rotating device 6 at step 101, and simultaneously, at step 102, the high voltage generator 10 applies a voltage to the needle-like second electrode 50 so as to produce a spark discharge between the needle-like electrodes 3 and 5 along the surface of the insulator 1. The light receiving device 11 receives, at its front end 11a, only light which is from the spark discharge and which passes over the top portion 1b of the insulator 1, and it leads the received light to the photoelectric converting device 12 so that the light is photoelectric converted. At step 103, an electric signal obtained by the photoelectric conversion, is produced as indicated by A in FIG. 4. If spark discharge passes an electrical discharge path with no defect, that is, all of the spark discharge will pass over the top portion 1b of the insulator 1 and will produce a large signal such as shown in A of FIG. 4. However, an electric signal as indicated by B in FIG. 4, which is extremely small in comparison with the signal A, or no signal at all is produced if the spark discharge does not pass over the top portion 1b of the insulator 1. No spark discharge at all will occur if the insulator is defective, so that the spark discharge passes through a defect. A discriminating step 104 determines whether or not the spark discharge passes over the top portion of the 1b of the insulator 1 with the timing signal from the high voltage generator being used as a trigger. This discriminating step, for example can be shown in FIG. 4 so that a discriminating value is given between the level of a signal which is obtained by the spark discharge that passes over the top portion 1b of the insulator 1 and the level of a signal which is obtained by the spark discharge that does not pass over the top portion 1b of the insulator 1. Accordingly step 104 makes a determination of whether or not a peak value of a signal after photoelectric conversion at the time of a rise of the timing signal pulse is higher than the discriminating value. If it is higher than the discriminating value, it is determined that the spark discharge has passed over the top portion 1b of the insulator 1, that is, it has passed over the electric discharge path and there is no defect in the insulator. The process is then advanced to step 105 which determines whether a set number of electric cycles of electric discharge have been completed. Accordingly, at the first time, the process is returned to step 2 after setting as electric discharge cycle number N=1, and then, after the process progresses to step 104, if the result of the discrimination at the step 104 exhibits a higher peak value, an increment of N=N+1 is performed at step 105. As far as the result of the discrimination at step 104 exhibits a higher peak value, the steps 102 to 105 are repeated until the cycle number of the electric discharge reaches the set value. It is noted here that the set cycle number of the electric discharge is determined depending upon the rotational speed of the insulator 1 and the frequency of the higher voltage electric discharge. For example, estimating the rotational speed of the insulator 1 as 60 rpm, and the frequency of the high voltage electric discharge as 100 Hz, 100 cycles of electric discharge are effected per rotation of the insulator 1. If the set cycle number of electric discharge is given by 100, the process is completed after one rotation of the insulator 1 is completed so that steps 102 to 105 are repeated for 100 cycles after that, the process is advanced to the next step 106 at which acceptance is indicated, unless the result of the discrimination at step 104 exhibits a higher peak value than the set limit. If a signal after photoelectric conversion is lower than the discriminated value at step 104, it is discriminated that the spark discharge has not passed over the top portion 1b of the insulator, and the insulator therefore has a defect. Then, the process is advanced to step 107 where the insulator is indicated as unacceptable. The process is advanced from step 106 or 107 to step 108, where the rotation of the insulator 1 is stopped, and the inspection thereof is completed.

Figure 5:
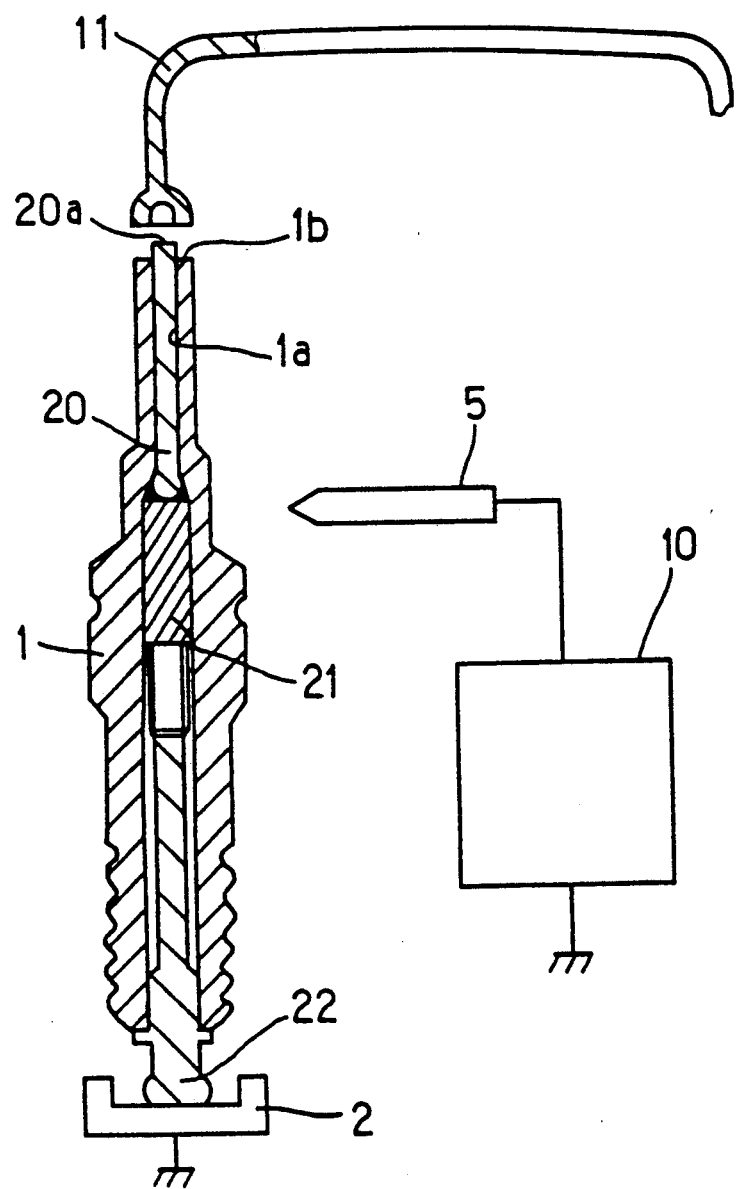
FIG. 5 is a general view illustrating a defect detecting apparatus according to a second embodiment of the invention.

FIG. 5 is a view which shows a defect detecting apparatus for insulators, according to a second embodiment of the present invention.

In FIG. 5, like parts corresponding to those in the first embodiment are denoted by like reference numerals.

In the second embodiment, a center electrode 20 is previously formed in the hollow section 1a of an insulator 1. accordingly, it is not necessary to insert the electrode 3 in to the hollow section 1a of the insulator 1 as required in the first embodiment. Instead, the center electrode 20 is grounded by a terminal fitting 22 which is electrically conductive to a resistor 21. When the high voltage generator 10 applies a high voltage to the second electrode 5 set outside of the insulator 1, a spark discharge is produced between the center electrode 20 and the second electrode 5. In this second embodiment, the front end part 11a of the light receiving device also has a doughnut-like part corresponding to the top portion 1b of the insulator 1, and the other components such as the path recognizing means and the like have the same structures as those in the first embodiment.

Next, explanation will be made of the operation of the second embodiment.

When the high voltage generator 10 applies a high voltage to the second electrode 5 set outside of the insulator 1 in the second embodiment, a spark discharge is generated between the second electrode 5 and the top portion 20a of the center electrode 20 if no defect is present in the insulator 2. Accordingly, the light receiving device 11 can receive light from the thus produced spark discharge, and therefore, it is determined with the use of a process similar to that in the first embodiment, by means of the path recognizing device that the insulator 1 is satisfactory.

However, if a defect such as a pinhole or the like is present in the insulator 1 in the second embodiment,, the spark discharge is generated between the center electrode and the second electrode through this defect in the insulator 1, and accordingly, the light receiving device 11 which is set facing the top portion 1b of the insulator 1 cannot receive sufficient light from the spark discharge. This makes it possible to determine, by the path recognizing means, not shown, using a process similar to the process in the first embodiment, that this insulator is unsatisfactory.

Figure 6:
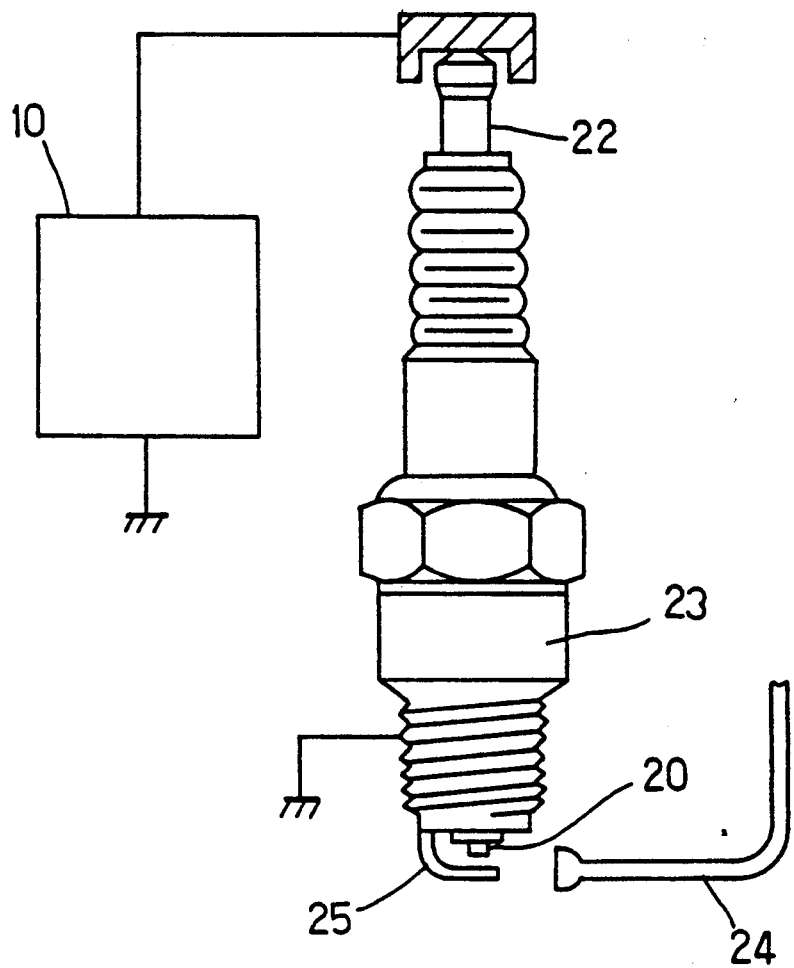
FIG. 6 is a general view illustrating a defect detecting apparatus according to a third embodiment of the invention.
Figure 7:
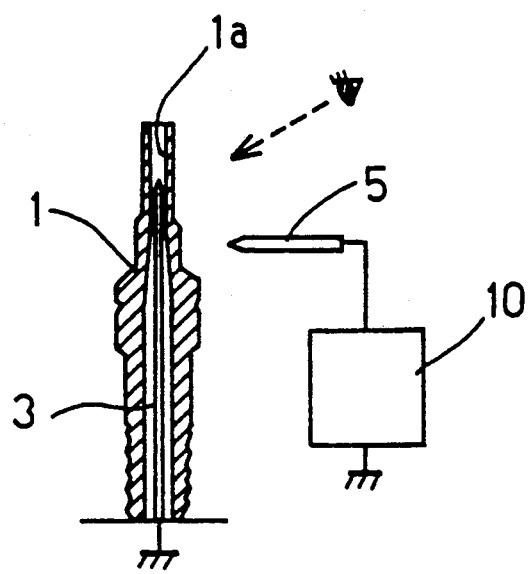
FIG. 7 is an explanatory view showing a conventional method of detecting a defect in an insulator.

FIG. 6 is a view which shows a defect detecting device according to a third embodiment of the present invention.

In FIG. 6, like parts corresponding to those in the first embodiment are denoted by like reference numerals.

In the third embodiment, an insulator to be inspected is incorporated in a spark plug.

In the third embodiment, the housing 23 of the spark plug is grounded, and the high voltage generator 10 is connected to the terminal fitting 22.

Further, the light receiving device 24 is provided so as to receive light from the center electrode 20 and the earth electrode 25 which is electrically conductive to the housing 23.

Further, the other components such as the path recognizing means and the like have the same structures as those in the first embodiment.

Next, explanation will be made of the operation of the third embodiment.

In the third embodiment, when the high voltage generator 10 applies a high voltage to the terminal fitting 22, a spark discharge is generated between the center electrode 20 which is electrically conductive to the terminal fitting 22 and the earth electrode 25 which is electrically conductive to the housing 23, if no defect such as a through-hole or the like is present in the insulator 1. Accordingly, the light receiving device 24 for receiving light between the center electrode 20 and the earth electrode 25 can catch light from this spark discharge, and therefore the path recognizing means which is not shown and which operates under the same operation as that of the first embodiment can determine that the insulator 1 is satisfactory.

However, if a defect such as a through-hole is present in the insulator 1, a spark discharge is not generated between the center electrode 20 and the earth electrode 25 but is generated directly between the center electrode 20 and the housing 23 so that the light receiving device 11 cannot receive sufficient light. Accordingly, the path recognizing means which is not shown and which operates under the same operation as that of the first embodiment, can determine that the insulator 1 is unsatisfactory.

The present invention should not limited to the arrangements of the above-mentioned embodiments, but can be applied to other such arrangements that whether or not an electric discharge which is generated between the inside and the outside of the above mentioned insulator passes through a predetermined path of electric discharge can be detected. For example, such an arrangement that a high voltage is applied to the needle-like electrode in the hollow section of the insulator while the needle-like electrode outside of the insulator is grounded, can be also included in the technical scope of the present invention. Further, a computer can be used as the comparing and computing device 13 and the indicator 14. In this case, the output from the photoelectrically converting device 12 is delivered, after A/D-conversion, to the computer so as to be discriminated and indicated by a program. Further, a signal indicating whether or not an insulator to be inspected is satisfactory, can be used for the control of a manufacture line without the indicator 14.

Although it has been explained that the rotation of the rotating device for an insulator to be inspected is stopped after every inspection in the above-mentioned embodiment, the present invention should not limited to this, but the rotation can be continued without being stopped. Further, it has been explained that the discrimination is made with the use of a peak value of an electric signal at discriminating step 104 after photoelectric conversion in the above-mentioned embodiment, but it is possible to use a effective value of the signal for the discrimination.

Further, although explanation has been made in the above-mentioned embodiments such that the completion of the inspection can be determined by the cycle number of electric discharge, the inspection can be completed when an insulator to be inspected is rotated by more than one rotation which can determined by an rotating angle or a time.

Further, although the optical fibers are used as the path detecting means in the above-mentioned embodiment, but the present invention should not limited to this arrangement, but, instead, a camera and an image measuring computer can be used. In this case, an image around a specific part of an insulator to be inspected, which is taken by the camera is inputted to the computer which therefore discriminate the insulator by a program set beforehand in the computer.

In the above-mentioned embodiment, it has be explained such an example that whether or not an electric discharge is present in a specific part where the path of electric discharge differs depending upon a satisfactory insulator or an unsatisfactory insulator, is determined with the use of spark discharge, but the present invention should not be limited to those using such a spark electrode. For example, such a method that the detection can be made with the use of a change in physical value such as special potential difference produced upon electric discharge, electric discharge plasma temperature or the like, of a similar change which is dependent upon an electric discharge, can be used, without being limited to the method using a spark discharge.

As mentioned above, according to the present invention which is based on the path of electric discharge differing depending upon whether a high voltage is applied to a satisfactory insulator or an unsatisfactory insulator, with the use of such a simple arrangement that whether or not an insulator is satisfactory or not is determined depending upon whether or not an electric discharge passes through a predetermined path with which the difference is indicated, the inspection in which visual checking by human eyes has been inevitable, can be automated so as to attain labor-saving operation in which whether or not an insulator is satisfactory can be determined surely.

What we claim is:

1. An apparatus for detecting a defect in an insulator to be tested, which insulator has a hollow section which opens at a top end, comprising:
   a hold section for holding the insulator to be tested;
   an electric discharge means for producing a voltage which can cause an electric discharge between a hollow inside section of the insulator and an outside of said insulator across said top end;
   a path recognizing means for automatically recognizing said electric discharge produced by said electric discharge means passing through a predetermined path of electric discharge including said top end; and
   a discriminating means, receiving an indication from said path recognizing means that said electric discharge has passed said predetermined path, for discriminating whether said insulator is satisfactory in accordance with said recognizing by said path recognizing means.

2. An apparatus for detecting a defect in an insulator as set forth in claim 1, wherein said path recognizing means includes a light receiving means for receiving light having a quantity from an electric discharge produced by said electric discharge means, a photoelectric converting means for receiving said light so as to deliver an electric signal in accordance with the quantity of said light, and a comparing and computing means for receiving said electric signal from said photoelectrically converting means when said electric discharge means produces an electric discharge, and for comparing said electric signal with a predetermined set value so as to issue a defect signal if said electric signal is smaller than said set value.

3. An apparatus for detecting a defect in an insulator as set forth in claim 1, further comprising a turning device coupled to said hold section, for rotating said insulator about an axis thereof.

4. An apparatus for detecting a defect in an insulator as set forth in claim 1, wherein said electric discharge means includes a first electrode and a second electrode, said first electrode being adapted to be inserted in said hollow section and said second electrode being formed on a side surface of said insulator within a range where electric discharge is capable between said first electrode and said second electrode.

5. An apparatus as in claim 1, wherein said insulator is an insulator which has a hollow section of a substantially donut-like shape, and wherein said path recognizing means includes a light receiving device having a donut-shaped light receiving part adapted so that only light crossing said donut-shaped hollow space can be received by said light receiving part.

6. An apparatus for detecting a defect in an insulator formed therein within an axially extending hollow section in which a center electrode having a front end is fitted, and said insulator having a front end, comprising:
   a hold means for holding said insulator;
   a second electrode set on one side of said insulator within a range where electric discharge can be produced between itself and said center electrode;

an electric discharge means for applying a potential difference between said center electrode and said second electrode to produce an electric discharge;

a path recognizing means provided at the front end of said insulator and responsive to said electric discharge means producing said potential difference, for recognizing whether a spark discharge is produced between a front end of said center electrode and said second electrode across said front end when said electric discharge means applies said potential difference, to deliver a signal corresponding to the recognizing; and a discriminating means, receiving said signal, for discriminating whether said insulator is satisfactory, in accordance with said signal from the recognizing means.

7. An apparatus as in claim 6, wherein said insulator in an insulator which has a hollow section of a substantially donut-like shape, and wherein said path recognizing means includes a light receiving device having a donut-shaped light receiving part adapted so that only light crossing said donut-shaped hollow space can be received by said light receiving part.

8. An apparatus for detecting a defect in a spark plug for internal combustion engines, having an insulator formed therein, an axially extending hollow section in which a center electrode is formed, and also formed with, on the outside thereof, a housing which is provided with a ground electrode that can produce an electric discharge between itself and said center electrode across a top end of the insulator, comprising:

a hold means for holding said spark plug;

an electric discharge means for effecting a potential difference with which a spark discharge can be produced between the center electrode and said ground electrode or between said center electrode and said housing depending on a condition of the insulator;

a path recognizing means for recognizing whether a spark discharge is produced between said center electrode and said ground electrode along a path of said top end when said electric discharge means applies said potential difference, to issue a signal corresponding to the recognizing; and a discriminating means for discriminating whether said insulator is satisfactory, in accordance with said signal delivered from said path recognizing means.

9. A method for detecting a defect in an insulator which has a hollow section opening at the top end comprising:

a spark discharge generating step for generating a spark discharge between an inside of said insulator and an outside of said insulator;

an automatic path recognizing step for automatically recognizing a condition when said spark discharge produced by said spark discharge step passes through a predetermined path of spark discharge, which path travels across said top end; and a discriminating step for discriminating whether said insulator is satisfactory, in accordance with said automatic path recognizing step detecting said travel across said top end.

10. A method as in claim 9, wherein said insulator is an insulator which has a hollow section of a substantially donut-like shape, and wherein said path recognizing step includes the step of disposing a light receiving device having a donut-shaped light receiving part adapted to that only light going across said donut-shaped hollow space is received by said light receiving part.

* * * * *